(12) United States Patent
Zheng et al.

(10) Patent No.: US 9,806,217 B2
(45) Date of Patent: Oct. 31, 2017

(54) FULLY INTEGRATED CMOS-COMPATIBLE PHOTODETECTOR WITH COLOR SELECTIVITY AND INTRINSIC GAIN

(71) Applicant: William Marsh Rice University, Houston, TX (US)

(72) Inventors: Bob Yi Zheng, Oceanside, CA (US); Yumin Wang, Houston, TX (US); Nancy J. Halas, Houston, TX (US); Peter Nordlander, Houston, TX (US)

(73) Assignee: William Marsh Rice University, Houston, TX (US)

( * ) Notice: Subject to any disclaimer, the term of this patent is extended or adjusted under 35 U.S.C. 154(b) by 0 days.

(21) Appl. No.: 14/701,273

(22) Filed: Apr. 30, 2015

(65) Prior Publication Data

US 2015/0318415 A1    Nov. 5, 2015

Related U.S. Application Data

(60) Provisional application No. 61/986,546, filed on Apr. 30, 2014.

(51) Int. Cl.
*H01L 31/0232* (2014.01)
*H01L 31/108* (2006.01)
*H01L 31/18* (2006.01)

(52) U.S. Cl.
CPC .... *H01L 31/1085* (2013.01); *H01L 31/02327* (2013.01); *H01L 31/18* (2013.01)

(58) Field of Classification Search
None
See application file for complete search history.

(56) References Cited

U.S. PATENT DOCUMENTS

| | | | | |
|---|---|---|---|---|
| 7,728,366 B2* | 6/2010 | Oohashi | ............... | H01L 31/108 257/292 |
| 8,319,308 B2* | 11/2012 | Jeon | .................... | H01L 29/0692 257/471 |
| 8,476,598 B1* | 7/2013 | Pralle | ............... | H01L 27/14658 250/370.09 |
| 2006/0175551 A1* | 8/2006 | Fan | ......................... | G01J 5/02 250/353 |
| 2007/0187790 A1* | 8/2007 | Takahashi | ........... | H01L 27/1214 257/433 |
| 2009/0020701 A1* | 1/2009 | Frey | ......................... | G01J 1/02 250/336.2 |
| 2011/0101485 A1* | 5/2011 | Chan | .................... | G02B 6/4246 257/471 |

(Continued)

OTHER PUBLICATIONS

N. Teranishi et al.; "Evolution of Optical Structure in Image Sensors"; IEEE; IEDM12, pp. 533-536; 2012 (4 pages).

(Continued)

*Primary Examiner* — Angel Roman
(74) *Attorney, Agent, or Firm* — Osha Liang LLP (57) ABSTRACT

A metal-semiconductor-metal photodetecting device and method of manufacturing a metal-semiconductor-metal photodetecting device that includes a p-type silicon substrate with an oxide layer disposed on the p-type silicon substrate. Schotty junctions are disposed adjacent to the oxide layer on the p-type silicon substrate and a plasmonic grating disposed on the oxide layer. The plasmonic grating provides wavelength range selectability for the photodetecting device.

11 Claims, 5 Drawing Sheets

(56) References Cited

U.S. PATENT DOCUMENTS

| | | | | |
|---|---|---|---|---|
| 2011/0175183 | A1* | 7/2011 | Nabet | H01L 31/1085 257/432 |
| 2011/0227558 | A1* | 9/2011 | Mannion | B82Y 30/00 324/71.1 |
| 2012/0257204 | A1* | 10/2012 | Walters | C12Q 1/6837 356/445 |
| 2015/0109606 | A1* | 4/2015 | Peale | H01L 31/1136 356/30 |
| 2016/0064436 | A1* | 3/2016 | Uchida | H01L 27/14623 257/432 |

OTHER PUBLICATIONS

Yeo-Taek Yoon et al.; "Transmission type color filter incorporating a silver film based etalon"; Optics Express, vol. 18, No. 5; pp. 5344-5349; Mar. 1, 2010 (6 pages).
W. L. Barnes et al.; "Surface plasmon subwavelength optics"; Nature, vol. 424; pp. 824-830; Aug. 14, 2003 (7 pages).
A. Barbara et al.; "Optical transmission through subwavelength metallic gratings"; Physical Review B 66., 161403(R); Oct. 8, 2002 (4 pages).
A. Sobhani et al.; "Narrowband photodetection in the near-infrared with a plasmon-induced hot electron device"; Nature Communications; Mar. 27, 2013 (6 pages).
T. W. Ebbesen et al.; "Extraordinary optical transmission through sub-wavelength hole arrays"; Nature, vol. 391; pp. 667-669; Feb. 12, 1998 (3 pages).
K. Diest et al.; "Tunable Color Filters Based on Metal-Insulator-Metal Resonators"; Nano letters, vol. 9, No. 7; pp. 2579-2583; Jun. 15, 2009 (5 pages).
Ting Xu et al.; "Plasmonic nanoresonators for high-resolution colour filtering and spectral imaging"; Nature Communications; Aug. 24, 2010 (5 pages).
Fan Ye et al.; "Plasmonic Halos—Optical Surface Plasmon Drumhead Modes"; Nano Letters, pp. 519-523; Dec. 18, 2012 (5 pages).
Yeo-Taek Yoon et al.; "Color filter incorporation a subwavelength patterned grating in poly silicon"; Optics Express, vol. 16, No. 4; pp. 2374-2380; Feb. 18, 2008 (7 pages).
B. Zeng et al.; "Ultrathin Nanostructured Metals for Highly Transmissive Plasmonic Subtractive Color Filters"; Scientific Reports 3, 2840; Oct. 8, 2013 (9 pages).
C. Langhammer et al.; "Localized Surface Plasmon Resonances in Aluminum Nanodisks"; Nano Letters, vol. 8, No. 5; pp. 1461-1471; Apr. 5, 2008 (11 pages).
M. W. Knight et al.; "Aluminum for Plasmonics"; American Chemical Society Nano, vol. 8, No. 1; pp. 834-840; Nov. 25, 2013 (7 pages).
M. W. Knight et al.; "Aluminum Plasmonic Nanoantennas"; Nano Letters; pp. 6000-6004; Oct. 16, 2012 (5 pages).
Y. Ekinci et al.; "Plasmon resonances of aluminum nanoparticles and nanorods"; Journal of Applied Physics 104, 083107; 2008 (7 pages).
S. P. Burgos et al.; "Color Imaging via Nearest Neighbor Hole Coupling in Plasmonic Color Filters Integrated onto a Complementary Metal-Oxide Semiconductor Image Sensor"; American Chemical Society Nano, vol. 7, No. 11; pp. 10038-10047; Oct. 24, 2013 (10 pages).
P. B. Catrysse et al.; "Integrated color pixels in 0.18-μm complementary metal oxide semiconductor technology"; J. Opt. Soc. Am. A; vol. 20, No. 12; pp. 2293-2306; Dec. 2003 (14 pages).
Qin Chen et al.; "CMOS Photodetectors Integrated With Plasmonic Color Filters"; IEEE Photonics Technology Letters, vol. 24, No. 3; pp. 197-199; Feb. 1, 2012 (3 pages).
Yun Seon Do et al.; "Plasmonic Color Filter and its Fabrication for Large-Area Applications"; Advanced Optical Materials, 2013, 1; pp. 133-138; Feb. 12, 2013 (6 pages).
D. Inoue et al.; "Polarization independent visible color filter comprising an aluminum film with surface-plasmon enhanced transmission through a subwavelength array of holes"; Applied Physics Letters; 98, 093113; 2011 (4 pages).
S. Yokogawa et al.; "Plasmonic Color Filters for CMOS Image Sensor Applications"; Nano Letters; pp. 4349-4354; Jul. 16, 2012 (6 pages).
G. Konstantatos et al.; "Sensitive solution-processed visible-wavelength photodetectors"; Nature Photonics; vol. 1; pp. 531-534; Sep. 3, 2007 (4 pages).
J. Burm et al.; "Low-Frequency Gain in MSM Photodiodes Due to Charge Accumulation and Image Force Lowering"; IEEE Photonics Technology Letters, vol. 8, No. 1; pp. 113-115; Jan. 1996 (3 pages).
J. H. Burroughes et al.; "Doping-Induced Bandwidth Enhancement in Metal-Semiconductor-Metal Photodetectors"; IEEE Photonics Technology Letters; vol. 3, No. 7; pp. 657-659; Jul. 1991 (3 pages).
D. K. Donald et al.; "Photocurrent amplification in Schottky photodiodes"; Applied Physics Letters, 49 (10); pp. 567-568; Sep. 8, 1986 (3 pages).
M. Klingenstein et al.; "Photocurrent Gain Mechanisms in Metal-Semiconductor-Metal Photodetectors"; Solid-State Electronics; vol. 37, No. 2; pp. 333-340; 1994 (8 pages).
T. Sugeta et al.; "High-Gain Metal-Semiconductor-Metal Photodetectors for High-Speed Optoelectronic Circuits"; IEEE Transactions on Electron Devices; vol. ED-26, No. 11; pp. 1855-1856; Nov. 1979 (2 pages).
S. Y. Chou et al.; "Nanoscale Tera-Hertz Metal-Semiconductor-Metal Photodetectors"; IEEE Journal of Quantum Electronics, vol. 28, No. 10; pp. 2358-2368; Oct. 1992 (11 pages).
S. Y. Chou et al.; "Ultrafast nanoscale metal-semiconductor-metal photodetectors on bulk and low-temperature grown GaAs"; Applied Physics Letters, vol. 61, No. 7; pp. 819-821; Aug. 17, 1992 (3 pages).
M. Löken et al.; "Fabrication of ultrafast Si based MSM photodetector"; Electronics Letters; vol. 34, No. 10; pp. 1027-1028; May 14, 1998 (2 pages).
B. J. Van Zeghbroeck et al.; "105-GHz Bandwidth Metal-Semiconductor-Metal Photodiode"; IEEE Electron Device Letters; vol. 9, No. 10; pp. 527-529; Oct. 1988 (3 pages).
R. A. Pala et al.; "Design of Plasmonic Thin-Film Solar Cells with Broadband Absorption Enhancements"; Advanced Materials, 21; pp. 3504-3509; Jun. 2, 2009 (6 pages).
E. S. Barnard et al.; "Photocurrent mapping of near-field optical antenna resonances"; Nature Nanotechnology; vol. 6; pp. 588-593; Aug. 21, 2011 (6 pages).
A. W. Sarto et al.; "Photocurrents in a Metal-Semiconductor-Metal Photodetector"; IEEE Journal of Quantum Electronics; vol. 33, No. 12; pp. 2188-2194; Dec. 1997 (7 pages).
Jian Kang et al.; "Dark Current Suppression for Germanium Metal-Semiconductor-Metal Photodetector by Plasma Post-Oxidation Passivation"; IEEE; pp. 140-141; 2013 (2 pages).
D. K. Schroder; "Carrier Lifetimes in Silicon"; IEEE Transactions on Electron Devices, vol. 44, No. 1; pp. 160-170; Jan. 1997 (11 pages).
J. M. Dorkel et al.; "Carrier Mobilities in Silicon Semi-Empirically related to Temperature, Doping and Injection Level"; Solid-State Electronics, vol. 24, No. 9; pp. 821-825; 1981(5 pages).
Sheng S. Li et al.; "The Dopant Density and Temperature Dependence of Electron Mobility and Resistivity in n-Type Silicon"; Solid-State Electronics; vol. 20; pp. 609-616; 1977 (8 pages).
S. V. Averine et al.; "Transit-time considerations in metal-semiconductor-metal photodiode under high illumination conditions"; Solid-State Electronics 44; pp. 1627-1634; 2000 (8 pages).
J. P. Clifford et al. "Fast, sensitive and spectrally tuneable colloidal-quantum-dot photodetectors"; Nature Nanotechnology; Nov. 9, 2008 (5 pages).
Xiong Gong et al.; "High-Detectivity Polymer Photodetectors with Spectral Response from 300 nm to 1450 nm"; Science; vol. 325; pp. 1665-1667; Sep. 25, 2009 (4 pages).
PingAn Hu et al.; "Highly Responsive Ultrathin GaS Nanosheet Photodetectors on Rigid and Flexible Substrates"; Nano Letters; pp. 1649-1654; Mar. 6, 2013 (6 pages).
O. Lopez-Sanchez et al.; "Ultrasensitive photodetectors based on monolayer MoS2"; Nature Nanotechnology; vol. 8; pp. 497-501; Jun. 9, 2013 (5 pages).

(56) References Cited

OTHER PUBLICATIONS

D. C. Oertel et al.; "Photodetectors based on treated CdSe quantum-dot films"; Applied Physics Letters, 87, 213505; Nov. 18, 2005 (4 pages).
Arthur Zhang et al.; "Ultrahigh Responsivity Visible and Infrared Detection Using Silicon Nanowire Phototransistors"; Nano Letters; pp. 2117-2120; May 14, 2010 (4 pages).
Xueton Gan et al.; "Chip-integrated ultrafast graphene photodetector with high responsivity"; Nature photonics; vol. 7; pp. 883-887; Sep. 15, 2013 (5 pages).
Yuan Liu et al.; "Plasmon resonance enhanced multicolour photodetection by graphene"; Nature Communications; Dec. 6, 2011 (7 pages).
A. Pospischil et al.; "CMOS-compatible graphene photodetector covering all optical communication bands"; Nature Photonics, vol. 7; pp. 892-896; Sep. 15, 2013 (5 pages).
Yongzhe Zhang et al.; "Broadband high photoresponse from pure monolayer graphene photodetector"; Nature Communications; May 7, 2013 (11 pages).

\* cited by examiner

content truncated …

FULLY INTEGRATED CMOS-COMPATIBLE PHOTODETECTOR WITH COLOR SELECTIVITY AND INTRINSIC GAIN

CROSS-REFERENCE TO RELATED APPLICATIONS

This application is a non-provisional patent application of U.S. Provisional Patent Application Ser. No. 61/986,546, filed on Apr. 30, 2014, and entitled: "Fully Integrated CMOS-Compatible Photodetector with Color Selectivity and Intrinsic Gain." Accordingly, this non-provisional patent application claims priority to U.S. Provisional Patent Application Ser. No. 61/986,546 under 35 U.S.C. §119(e). U.S. Provisional Patent Application Ser. No. 61/986,546 is hereby incorporated in its entirety.

STATEMENT REGARDING FEDERALLY SPONSORED RESEARCH OR DEVELOPMENT

The invention was made with government support under Grant Number N00014-10-1-0989 awarded by the Office of Naval Research. The invention was made with government support under Grant Number N00244-09-1-0067 awarded by the Department of Defense. The government has certain rights in the invention.

BACKGROUND

Over one billion silicon-based image sensors were produced worldwide in 2013. Typically, imaging sensors use p-n or p-i-n junctions to separate and collect photo-excited electron-hole pairs. For low-light situations and high-density pixels, a single photodiode may produce small amounts of photocurrent, limited by the quantum efficiency of light absorption and requiring extremely low-noise electronics to amplify the signal.

Typically, imaging sensors may use pn or p-i-n photodiodes as photodetectors and perform color selection with dielectric or organic dye color filters. For low light or high pixel density sensors, photodiodes may require ultralow-noise amplifiers since they do not exhibit photocurrent gain. Dielectric filters are typically fabricated off-chip, limiting their use with small pixels; organic dye filters degrade under exposure to ultraviolet light, limiting their durability.

SUMMARY

In one aspect, embodiments of the invention relate to a metal-semiconductor-metal photodetecting device that includes a p-type silicon substrate with an oxide layer disposed on the p-type silicon substrate. Schotty junctions are disposed adjacent to the oxide layer on the p-type silicon substrate and a plasmonic grating disposed on the oxide layer. The plasmonic grating provides wavelength range selectability for the photodetecting device.

In another aspect, embodiments of the invention relate to a method of manufacturing a photodetecting device that includes reactive ion etching a thermally grown oxide layer on a p-type silicon substrate using $CF_4$ and $O_2$ gases and sonicating the substrate in acetone, followed by rinsing the substrate with isopropyl alcohol, and drying with $N_2$ gas. The method further includes forming Schottky junctions on the substrate and using e-beam lithography to dispose a plasmonic grating on the oxide layer. The plasmonic grating provides wavelength range selectability for the photodetecting device.

BRIEF DESCRIPTION OF DRAWINGS

Certain embodiments of the disclosure will be described with reference to the accompanying drawings. However, the accompanying drawings illustrate only certain aspects or implementations of the disclosure by way of example and are not meant to limit the scope of the claims.

DETAILED DESCRIPTION

Specific embodiments will now be described with reference to the accompanying figures. In the following description, numerous details are set forth as examples of the invention. It will be understood by those skilled in the art that one or more embodiments of the present disclosure may be practiced without these specific details and that numerous variations or modifications may be possible without departing from the scope of the invention. Certain details known to those of ordinary skill in the art are omitted to avoid obscuring the description.

In general, embodiments of the invention relate to a photodetector. Embodiments of the invention may include a Metal-Semiconductor-Metal (MSM) photodetector which may achieve color sensitivity without incorporating multiple materials. Embodiments of the invention may amplify the optoelectric signal intrinsically, without the need for amplifying circuitry. One or more embodiments of the invention may have applications in ultra-high resolution imaging at low light intensities and/or at high pixel densities.

In general, embodiments of the invention provide a fully integrated, photodetector and color filter that may be fabricated entirely (or almost entirely) from aluminum and silicon and designed to detect light in selected wavelength bands across the visible spectrum. In one or more embodiments, the device may produce photocurrent gain while exploiting the plasmonic color filter for both wavelength selectivity and photocurrent enhancement. Embodiments of the invention may produce photocurrent gain by carrier accumulation, while exploiting the evanescent field of the surface plasmon for both wavelength selectivity and photocurrent enhancement.

In one or more embodiments, the photodetector device may exhibit a maximum responsivity of 12.54 A/W and a full-width-half-maximum (FWHM) spectral selectivity of approximately 100 nm. Embodiments of the invention may improve upon the typical maximum responsivity of p-n junction diodes of 1 A/W. One or more embodiments of the invention may provide photodetectors that simultaneously implement photocurrent gain with an ultra-thin integrated color filter. The color filter may also improve upon current technology by using a CMOS-compatible metal, which allows direct integration with the photosensor. Embodiments of the invention may include a more stable filter, as compared to contemporary filters that may exhibit degradation under exposure to UV light or other conditions. Embodiments of the invention may provide a fully integrated photodetector with immediate applications in low-light imaging and pixel-dense imaging sensors.

Plasmonic gratings may be used in fully integrated, spectrally sensitive detectors. Plasmonic gratings may be used as tunable optical bandpass filters. Plasmonic gratings utilize interference effects of surface plasmons, the coherent, charge oscillations of conduction band electrons, in a periodic structure to tune the center wavelength of a transmission band. Aluminum is a promising CMOS-compatible plasmonic material, possessing outstanding optical properties in the visible and near-UV spectral regions. Aluminum color filters shown full color tenability.

Figure 1:
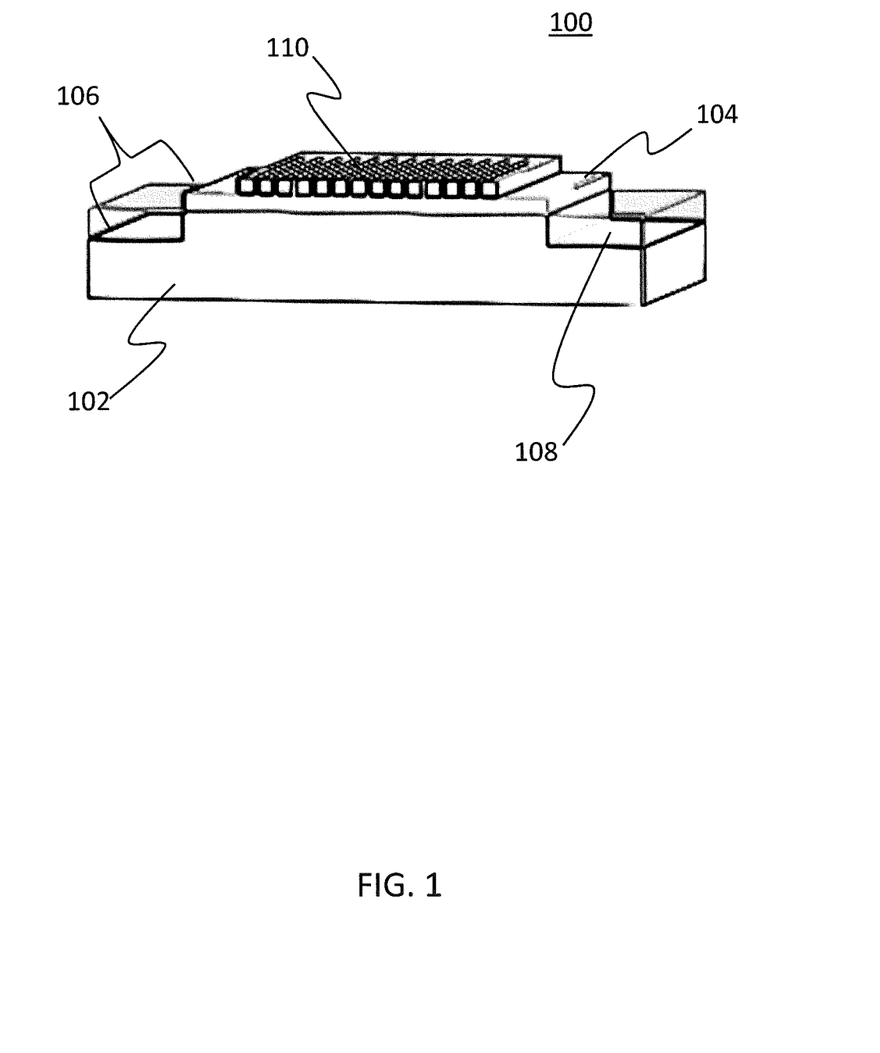
FIG. 1 shows a schematic of a metal-semiconductor-metal photodetector in accordance with one or more embodiments of the invention.

FIG. 1 is a schematic demonstrating a Metal-semiconductor-metal (MSM) photodetector in accordance with one or more embodiments of the invention. In FIG. 1, the MSM photodetector 100 includes a p-type silicon substrate 102 with a thin oxide layer 104. The MSM photodetector 100 also includes Schottky junctions 106 that are formed using a deposited contact 108. The MSM photodetector 100 further includes a grating 110. In one or more embodiments, the grating pitch may be used for selectivity of the wavelength of detection. In addition, the grating may provide addition photocurrent enhancement due to strong local fields of the plasmonic structure in accordance with one or more embodiments of the invention. Examples disclosed herein are demonstrated using aluminum; however, one of ordinary skill in the art will appreciate that embodiments of the invention are not limited to aluminum. Gold, silver, nickel and other metals may also be used in accordance with one or more embodiments of the invention.

Figure 2:
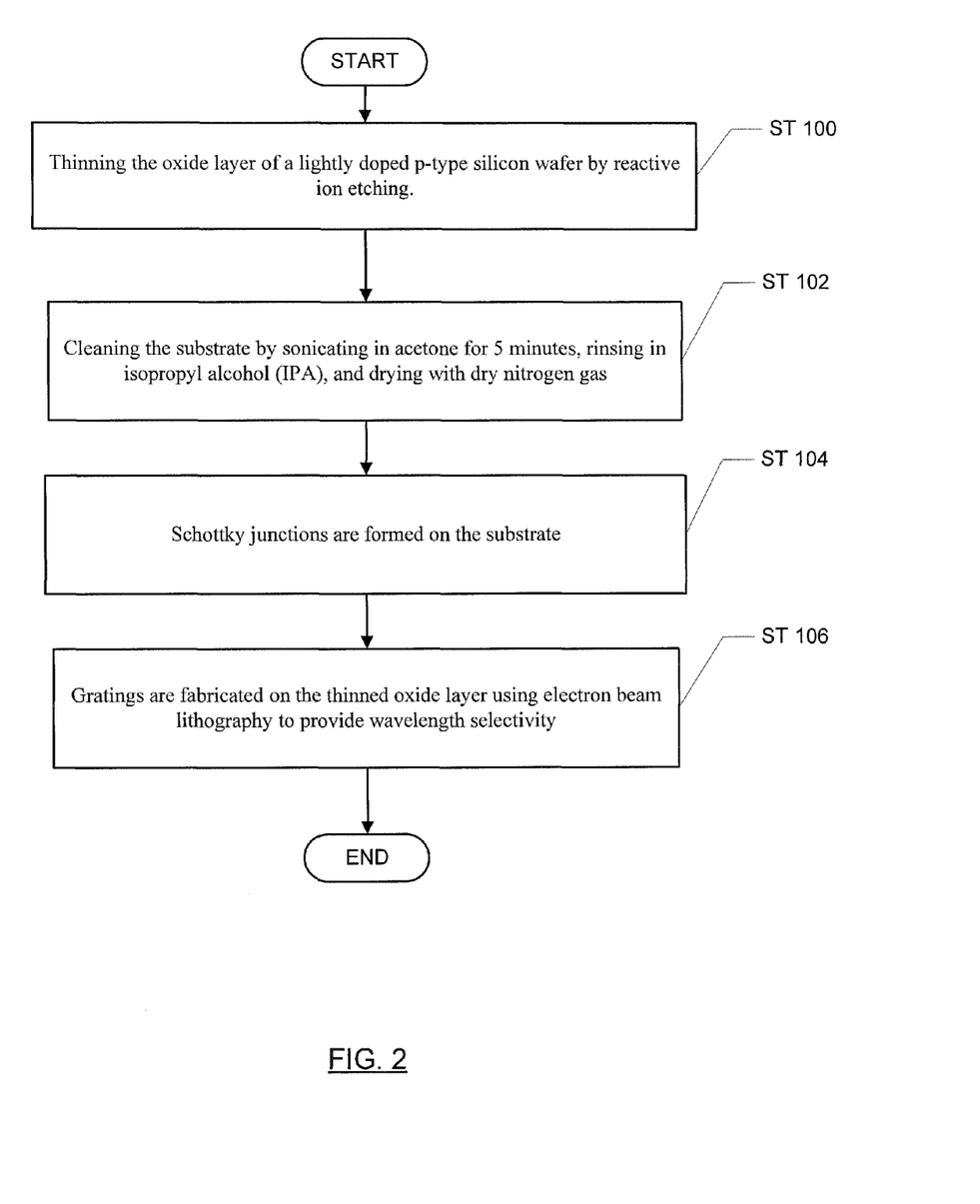
FIG. 2 shows a flow chart in accordance with one or more embodiments of the invention.

FIG. 2 shows a flow chart for manufacturing a MSM photodetector in accordance with one or more embodiments of the disclosure. In ST 100, a protecting thermal oxide layer of a lightly doped p-type silicon wafer is thinned by reactive ion etching. In one or more embodiments of the invention, the substrate is a lightly doped (10-30 Ω/cm) <100> p-type silicon wafer. The substrate may be initially protected by a thermally grown 100 nm oxide layer. The oxide layer may be thinned to 50 nm by reactive ion etching for 100 s using $CF_4$ and $O_2$ gases. In one or more embodiments, the etch parameters are adjusted to result in an oxide etch rate of ~0.5 nm/s. The etch rates and oxide thicknesses may be confirmed using ellipsometry techniques in accordance with one or more embodiments of the invention. After thinning the oxide, in ST 102, the samples may be cleaned by sonicating in acetone for at least 5 minutes, rinsing in isopropyl alcohol (IPA), and drying with dry nitrogen gas.

In ST 104, Schottky junctions are formed on the substrate. In one or more embodiments of the invention, the Schottky junctions may be aluminum-silicon, measuring approximately 10 μm×10 μm. The Schottky junctions may be formed via photolithography in accordance with one or more embodiments of the invention. For example, to form the Schottky junctions, a photoresist may be spin-coated onto the chip and exposed for 5 s. The resist may then be developed for 60 s and dry etched for 100 s to open up contact areas. In one or more embodiments of the invention, the last 5 seconds of etching may be performed in $CF_4$ gas only. The substrate may then be immediately transferred to an electron-beam evaporation chamber. In accordance with one or more of the embodiments, the overall exposure time to atmosphere may be kept to a minimum to reduce oxidation at the silicon-contact interface.

For example, in one or more embodiments, a 100 nm aluminum layer was deposited at a rate of 0.7 Å/s at a base pressure of 5.0e-7 Torr to form aluminum contacts. The aluminum deposition was followed by a gold deposition of 100 nm. The gold layer is used solely for alignment marks in the subsequent lithography step and does not affect the electrical properties of the photodetector. The excess metal and photoresist may be removed by soaking in acetone at room temperature for 15 minutes and rinsing in IPA.

In ST 106, gratings are patterned on the thinned oxide layer using electron beam lithography. The e-beam resist may be developed for 50 s in a 3:1 solution of IPA:methyl isobutyl ketone. Liftoff may be performed by soaking in acetone at ambient for 15 minutes and rinsing in IPA. For example, gratings measuring 7 μm by 15 μm may be fabricated using electron beam lithography. The grating slits may be maintained at a constant 100 nm by 5 μm long for the photodetectors. In one or more embodiments of the invention, the gratings may be a 50 nm thick aluminum grating. The color detection window of the photodetector may be tuned by increasing or decreasing the pitch distance between the slits. For example, a slit pitch of 300 nm may be optimal for blue light, 400 nm for green light, and 500 nm for red light in accordance with one or more embodiments of the invention.

In one or more embodiments of the invention, the Schottky junctions may be extremely sensitive to oxidation at the aluminum-silicon interface. This may be remedied by limiting or eliminating air exposure to the device when the Schottky junctions are formed. Further, although the contacts and grating are demonstrated using aluminum, one of ordinary skill in the art will appreciate that the metal used in embodiments of the invention are not limited to aluminum. Gold, silver, and other metals may also be used without departing from the scope of the embodiments of the invention. Further, as noted above, the contacts may be fabricated using photolithography and the gratings may be fabricated using electron beam lithography. However, other techniques may be envisioned for assembling the contacts and grating.

The electric and optoelectronic properties of embodiments of the devices have been characterized using a custom-built photocurrent microscope. First, the dark electrical properties were obtained by connecting a single photodetector with two microprobes and measured using a picoammeter. Then, the aluminum gratings were illuminated at near-normal incidence using a broadband white light laser. Wavelength selection of the light source was accomplished using an acousto-optic tunable filter. The laser was focused to a diffraction-limited spot at the center of each plasmonic filter. An unpatterned region on the chip was used as a reference, for correcting the device response for the wavelength-dependent power profile of the laser. All measurements were performed with the incident light polarized transverse to the long slit axis. The gratings yielded no significant photocurrent when driven by light polarized along the longitudinal axis of the grating lines.

Embodiments of the photodetector may be modeled using 2D finite difference time domain simulations. The model consists of a periodic grating array with theoretical geometries close to actual device geometries and literature values for all dielectric functions were used. A 10 nm aluminum oxide layer may be used to account for the surface oxide of the aluminum. Periodic boundary conditions may be used to simulate an infinite grating array. A linearly polarized plane wave light pulse was injected at normal incidence with the polarization transverse to the slit. Perfectly matched layers (PMLs) at the top and bottom of the simulation space reduce unphysical back-reflections in the simulation space. The simulations may be checked for numerical accuracy through convergence testing. The absorption is integrated over the top 10 μm of silicon in the simulation geometry.

For example, in one embodiment of a MSM photodetector composed of a 50 nm thick aluminum grating, a 50 nm oxide layer and Al—Si Schottky junctions on a p-type silicon substrate, the oxide layer may electrically passivate the silicon and act as an optical spacer for the aluminum grating. Simulations performed on the example device geometry and other studies indicate that a spacer thickness between 30 nm and 100 nm may optimize the optoelectric response. The aluminum grating filters the input light and provides an additional photocurrent enhancement due to strong local fields in accordance with one or more embodiments of the invention.

Figure 3A:
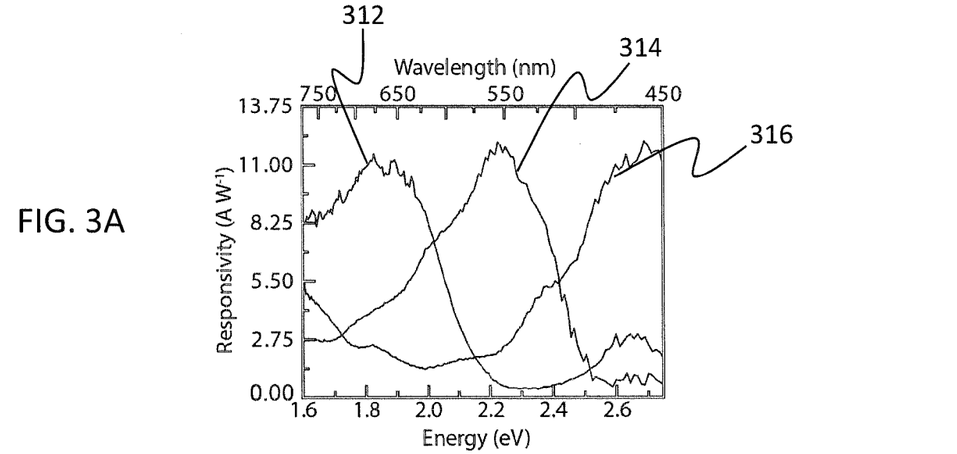
FIGS. 3A and 3B show spectral responses of a MSM photodetector in accordance with one or more embodiments of the invention.
Figure 3B:
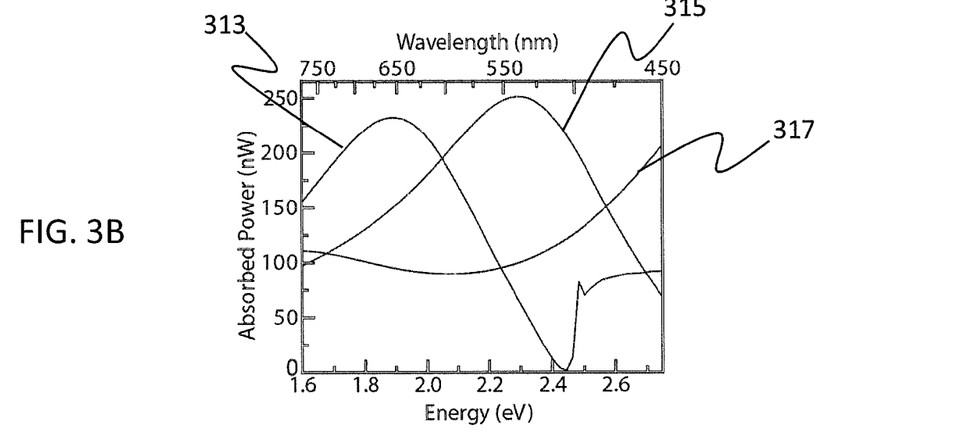

FIGS. 3A and 3B show spectral responses of a MSM photodetector in accordance with one or more embodiments of the invention. FIG. 3A shows measured responsivities of red 312, green 314, and blue 316 photodetectors in accordance with one or more embodiments of the invention. In accordance with one or more embodiments of the invention, the red 312, green 314, and blue 316 photodetectors were fabricated with grating pitches of 500 nm, 400 nm, and 300 nm, respectively. The full-width-at-half maximum (FWHM) is ~90 nm for the blue detector, ~100 nm for the green detector, and ~115 nm for the red detector. FIG. 3B shows simulated responsivities calculated using the techniques described above. As can be seen from FIG. 3B, the simulated responsivities for the red 313, green 315, and blue 317 photodetectors closely match the observed behavior shown in FIG. 3A.

Figure 4A:
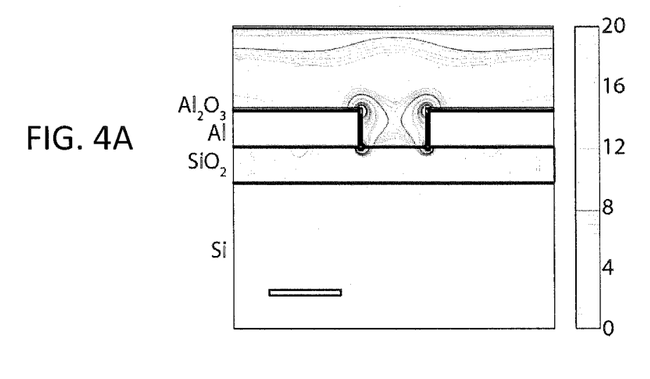
FIGS. 4A and 4B are time-averaged electric field enhancement plots of the device at maximal absorption (FIG. 4A) and minimal absorption (FIG. 4B) in accordance with one or more embodiments of the invention.
Figure 4B:
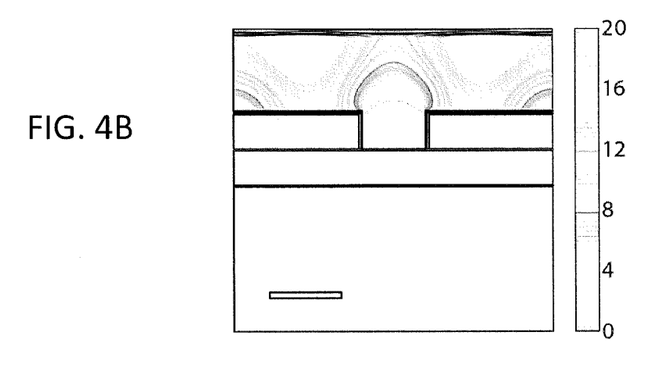

The asymmetric spectral response seen in FIG. 3A arises from the interference between incident light and light scattered by the photodetector. FIGS. 4A and 4B are time-averaged electric field enhancement plots of the device at maximal absorption (FIG. 4A) and minimal absorption (FIG. 4B) in accordance with one or more embodiments of the invention. As shown in FIGS. 4A and 4B, for light with frequencies below the interference resonance, constructive interference occurs (FIG. 4A) and the photodetector preferentially absorbs light. Conversely, light above the resonance frequency destructively interferes and the detector preferentially reflects light (FIG. 4B). During constructive interference, the high field enhancements of the plasmonic filter increase the in-coupling cross-section, resulting in additional photocurrent enhancement. In accordance with one or more embodiments of the invention, by varying the oxide thickness, the interference resonance may be tuned near the plasmonic grating resonance, simultaneously improving the spectral selectivity and photo current output.

Figure 5A:
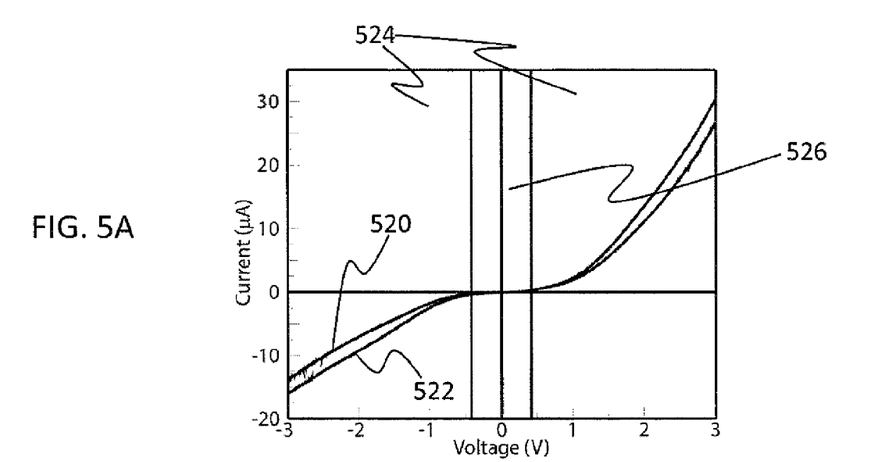
FIGS. 5A-5C describe current-voltage relationships in accordance with one or more embodiments of the invention.

In one or more embodiments of the invention, the photodetector may be characterized in a linear, small-signal regime, where the device conductance gives the charge carrier densities without gain. FIG. 5A shows representative current-voltage (I-V) curves for a dark 520 and illuminated 522 MSM photodetector in accordance with one or more embodiments of the invention. The device was illuminated on-resonance at 560 nm with 600 nW incident power. The extracted barrier height of 0.37 V and ideality factor of 1.12 agree with reported values of aluminum-silicon Schottky junctions. The asymmetry in the I-V curves is due to different amounts of oxidation at the aluminum-silicon interfaces, resulting in slightly different barrier heights for each Schottky junction. The photodetector produces 4.6 μA of photocurrent at 3 V bias, corresponding to a responsivity of 7.67 A/W.

For example, in accordance with one or more embodiments of the invention, maximum responsivity of 12.54 A/W for the blue detector, 12.07 A/W for the green detector, and 11.18 A/W for the red detector may be obtained. A volume averaged electric field enhancement of ~2.5 may result in a photocurrent enhancement of ~30%. Without gain, the theoretical maximum responsivity would be 1.3 A/W, strongly indicating that the photodetector has a built-in photocurrent gain mechanism.

In accordance with one or more embodiments of the invention, the MSM photodetector exhibits an active regime 524, and a linear regime 526. In the active regime 524, photogenerated carriers are swept to the junctions. However, the Schottky barriers may prevent immediate collection and may force the charges to accumulate between the junctions, lowering the Schottky barrier and inducing a photocurrent gain. In one or more embodiments of the invention, the long carrier lifetimes (~100 μs) in lightly doped silicon ensure low recombination rates, allowing for large photocurrent gains.

Figure 5B:
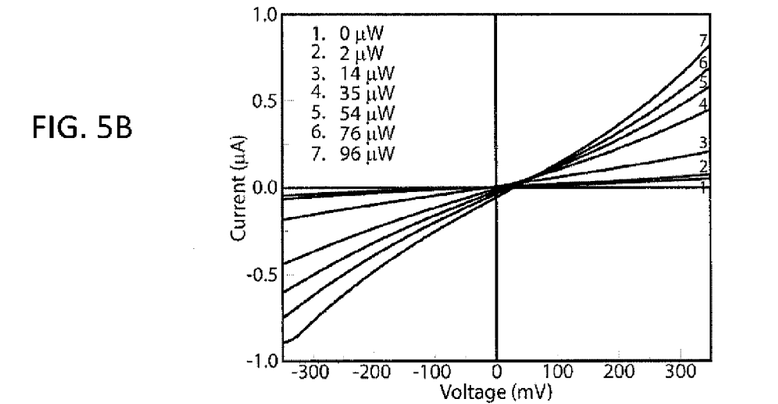
Figure 5C:
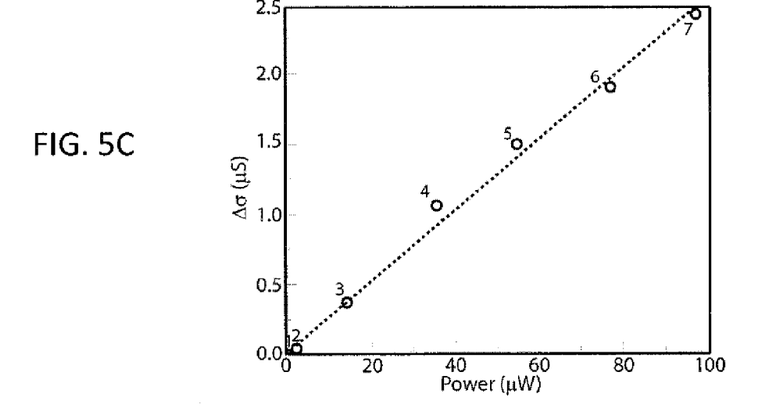

In the linear regime 526, the photodetector may act as a photoconductor and a direct measurement of photogenerated carrier densities without gain. FIG. 5B shows current-voltage curves for a device operated in the linear regime 526 illuminated by different laser powers in accordance with one or more embodiments of the invention. The I-V curves demonstrated in FIG. 5B show linear responses in the +/−100 mV range before becoming more exponential. FIG. 5C demonstrates the change in conductance as a function of laser power in accordance with one or more embodiments of the invention. In one or more embodiments, the device shows a linear dependence of the device conductance on the incident power. The slope of the change in the conductance gives a measure of the quantum efficiency by the relation:

$$\Delta\sigma = q(\mu_n + \mu_p) \cdot \Phi_\eta$$

where $\Delta\sigma$ is the change in conductance, q is the electric charge, $\mu_n$ and $\mu_p$ are the electron and hole mobilities, respectively, $\Phi$ is the photon flux, and $\eta$ is the quantum efficiency. The mobilities (1500 cm$^2$/(Vs) for electrons, 500 cm$^2$/(Vs) for holes) were estimated from the chip resistivity (16 Ω/cm) and literature values for known doping concentrations. The calculated quantum efficiency, 5.8%, corresponds to a photocurrent responsivity of 26.2 mA/W in accordance with one or more embodiments of the invention. The photodetector in the active regime exhibits a responsivity of 7.67 A/W, suggesting that the combined photocurrent enhancement and charge accumulation results in an intrinsic gain >290.

One metric for photodetectors is the minimum detectable signal. In accordance with one or more embodiments of the invention, a linear fit of the unilluminated small signal IV curve results in a shunt resistance of 5.96 GΩ and a leakage current of 2.05 nA. The Johnson noise spectral density may be estimated from $(4k_bTB/R)^{1/2}$ to be 1.64 fA Hz$^{-1/2}$. In these embodiments, the shot noise limit is determined from $(2qI_dB)^{1/2}$ to be 0.24 fA HZ$^{-1/2}$, here $k_b$ is Boltzmann's constant, T is the temperature, B is the noise bandwidth, R is the dark resistance, q is the electron charge, and $I_d$ is the dark current. The noise currents summed in quadrature gives a noise-equivalent power (NEP) of 1.66 fW HZ$^{-1/2}$, in agreement with other silicon detectors.

Embodiments of the invention may exhibit equal or better performance than previously reported plasmonic color filters. In one or more embodiments, the FWHM spectral selectivity may be less than 120 nm for all colors, whereas many known filters may have a FWHM>200 nm. Embodiments of the invention may have two orders of magnitude better responsivity than typical ultra-fast, telecommunications MSM photodetectors, due to the enhanced absorption and photocurrent gain. However, the photocurrent gain may limit the operating speed. A bandwidth estimate using transit time calculations gives:

$$B = \frac{\pi \mu V_{th}}{2L^2}$$

where B is the bandwidth, L is the distance between the junctions, $\mu$ is the mobility, and $V_{th}$ is the threshold voltage. For example, if $V_{th}$ is 0.36 V, L is 20 μm and μ may be estimated to be 500 cm²/(Vs), resulting in a 3-dB bandwidth of 6.9 GHz. For comparison, silicon photoconductors may have substantially higher responsivities (>10⁵ A/W), but much slower speeds (~KHz-MHz). Phototransistors may also exhibit photocurrent gain (>100) but at slower speeds (<10 MHz). Silicon nanowires and quantum dot detectors have shown high photocurrent gain (>100) but at slower speeds (~KHz). Graphene-based detectors with high speed (>1 GHz), and low noise have been demonstrated, but suffer from low responsivities (<150 mA/W). Other 2-dimensional materials like $MoS_2$ have shown high responsivities (>500) but at extremely low speeds (<0.1 Hz).

Embodiments of the invention may provide a high-performance MSM photodetector that utilizes charge accumulation for photocurrent gain and an integrated plasmonic filter for spectral selectivity. Embodiments of the invention may utilize near-field and thin-film interference effects to enhance the absorption and for a narrowband spectral response. Embodiments of the invention may advantageously provide for the motivation of the design and integration of Al plasmonic color filters in future CMOS-compatible imaging systems and photodetectors. Embodiments of the invention may utilize a charge trapping technique that may translate to broad impacts on the design and fabrication of color displays and novel imaging sensors.

While the invention has been described above with respect to a limited number of embodiments, those skilled in the art, having the benefit of this disclosure, will appreciate that other embodiments can be devised which do not depart from the scope of the invention as disclosed herein. Accordingly, the scope of the invention should be limited only by the attached claims.

What is claimed is:

1. A metal-semiconductor-metal photodetecting device, comprising:
a p-type silicon substrate;
an oxide layer disposed on the p-type silicon substrate;
Schottky junctions disposed adjacent to the oxide layer on the p-type silicon substrate; and
a plasmonic grating disposed on the oxide layer,
wherein the plasmonic grating provides wavelength range selectability for the photodetecting device,
wherein the plasmonic grating comprises:
a film, and
a plurality of perforations through the film.

2. The device of claim 1, wherein the oxide layer is ~50 nm thick.

3. The device of claim 1, wherein the plasmonic grating is ~50 nm thick.

4. The device of claim 1, wherein the Schottky junctions are formed using photolithography.

5. The device of claim 1, wherein the Schottky junctions are comprised of Aluminum.

6. The device of claim 1, wherein the plasmonic grating is formed by e-beam lithography.

7. The device of claim 1, wherein the plasmonic grating is comprised of Aluminum.

8. The device of claim 1, wherein a full width half maximum (FWHM) of a responsivity of the photodetecting device is less than 120 nm.

9. The device of claim 1, wherein the plasmonic grating is comprised of Aluminum.

10. The device of claim 1, wherein the device has a responsivity of at least 7.67 A/W.

11. The device of claim 1, wherein the plasmonic grating provides photocurrent enhancement.

* * * * *